United States Patent [19]
Tanimoto

[11] Patent Number: 5,162,799
[45] Date of Patent: Nov. 10, 1992

[54] A/D (ANALOG-TO-DIGITAL) CONVERTER

[75] Inventor: Hiroshi Tanimoto, Kawasaki, Japan

[73] Assignee: Kabushiki Kaisha Toshiba, Kawasaki, Japan

[21] Appl. No.: 800,014

[22] Filed: Nov. 29, 1991

[30] Foreign Application Priority Data

Nov. 30, 1990 [JP] Japan .................. 2-329504

[51] Int. Cl.⁵ .......................................... H03M 3/02
[52] U.S. Cl. ..................................... 341/143; 341/163
[58] Field of Search ......................... 341/143, 163, 166

[56] References Cited

U.S. PATENT DOCUMENTS 5,027,120  6/1991  Thurston .............................. 341/143

FOREIGN PATENT DOCUMENTS 1196922  8/1989  Japan .

OTHER PUBLICATIONS

A. Hairapetian et al., Multibit Sigma-Delta Modulator with Reduced Sensitivity to Dac Nonlinearity, Electronics Letters May 23, 1991, vol. 27, No. 11, pp. 990-991.

Primary Examiner—Marc Hoff
Attorney, Agent, or Firm—Oblon, Spivak, McClelland, Maier & Neustadt

[57] ABSTRACT

An A/D converter comprises a first stage integrator for receiving an input signal, a last stage integrator, a multibit A/D converter connected to the output terminal of the last stage integrator, an outer feedback loop connected between the output terminal of the multi-bit A/D converter and the input terminal of said first stage integrator and having a 1-bit D/A converter, an inner feedback loop connected between the output terminal of the multibit A/D converter and the input terminal of the last stage integrator and having a multibit D/A converter, and a digital signal processing circuit, connected to the output terminal of the A/D converter, for performing digital signal processing of an output from the A/D converter to eliminate quantization noise caused by the outer feedback loop.

17 Claims, 11 Drawing Sheets

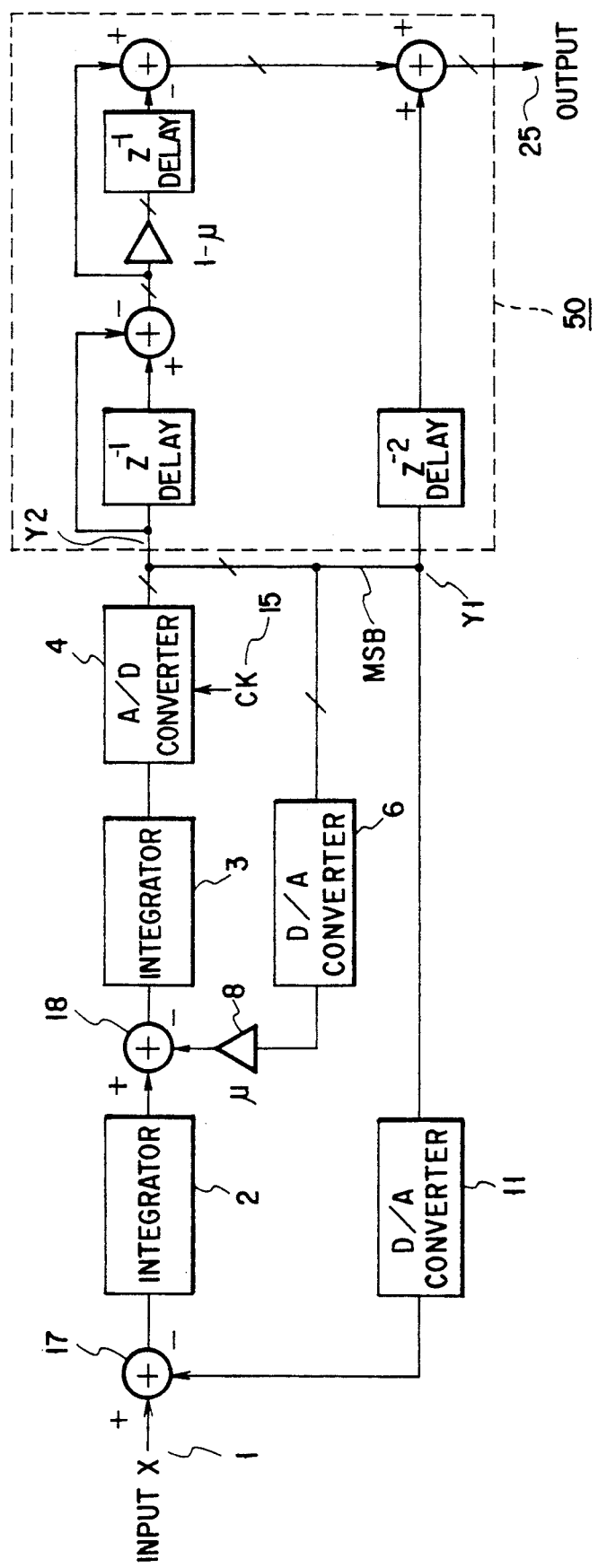
F I G. 3

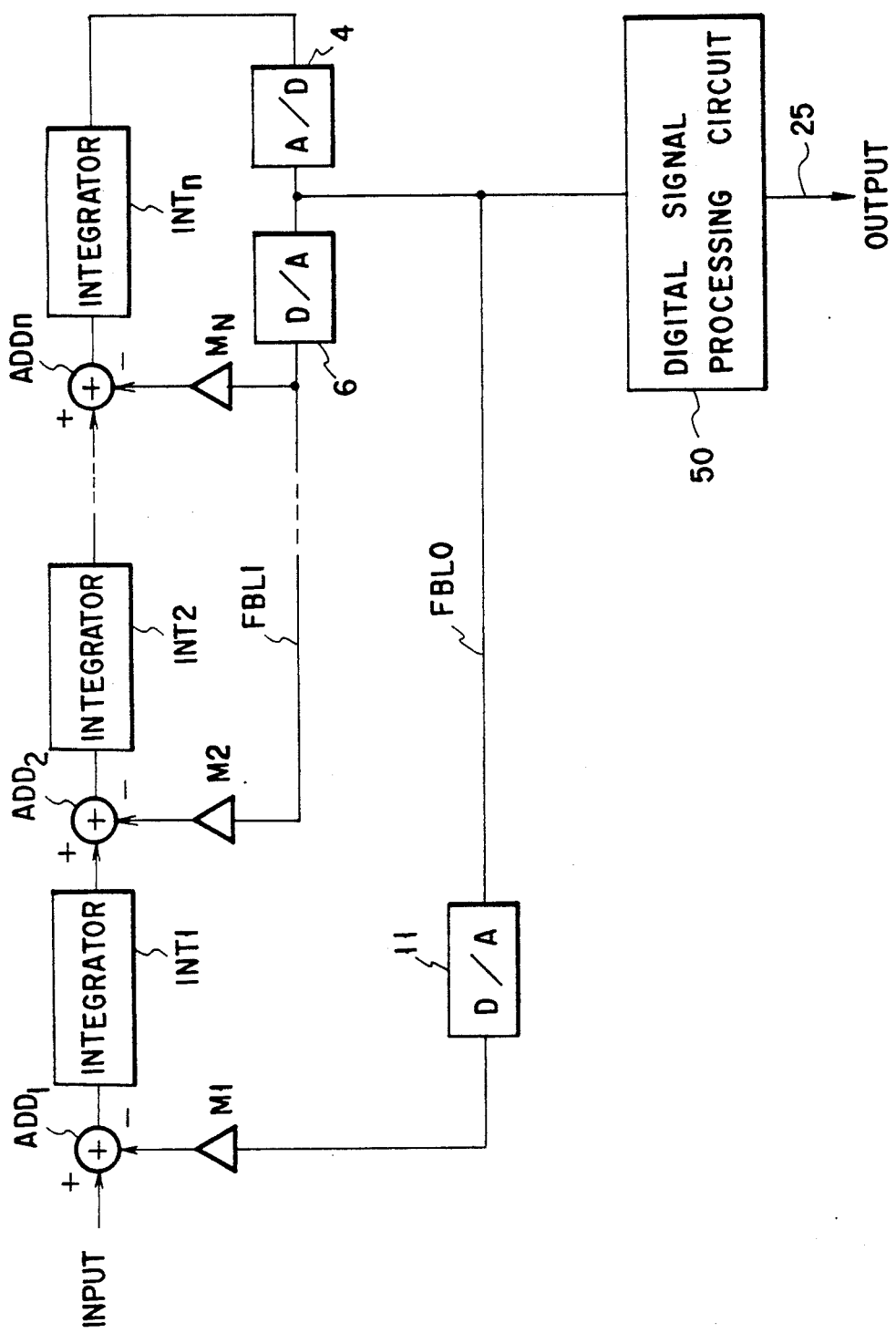
F I G. 10

A/D (ANALOG-TO-DIGITAL) CONVERTER

BACKGROUND OF THE INVENTION

1. Field of the Invention

The present invention relates to an over-sampling type A/D converter and, more particularly, to an A/D converter capable of performing conversion at a high accuracy.

2. Description of the Related Art

In a conventional A/D converter, it is considered that the number of quantized samples is increased to improve conversion accuracy. However, in order to perform this, a large number of code discriminators must be used, and an A/D converter having a large-scale arrangement must be used. For this reason, the following A/D converter is proposed. That is, in this A/D converter, upper bits are roughly determined by a discriminator, and lower bits are determined by this discriminator. In addition to the above A/D converter, an over-sampling type A/D converter represented by a $\Delta\text{-}\Sigma$ modulator has received a great deal of attention as A/D converter in which an A/D conversion characteristic having higher accuracy than that of a conventional A/D converter can be obtained by using 1-bit (binary) A/D & D/A converters. This A/D converter is a high-accuracy A/D converter suitable for an integrated circuit. That is, in this converter, even when an analog circuit element does not have high accuracy, an analog-to-digital conversion characteristic having high accuracy of, e.g., about 16 bits can be obtained. The $\Delta\text{-}\Sigma$ modulator is described in the literature, e.g., "Over-sampling type A/D & D/A conversion technique (first to sixth)", Akira Yukawa, Nikkei Electronics, No. 453–460, 1989.

In order to use the $\Delta\text{-}\Sigma$ modulator as a high-accuracy A/D converter, there are two conventional problems.

First, when an integration order is increased to third or more order to improve an S/N ratio by using a 1-bit D/A converter, an output signal cannot follow an input signal to cause conversion to be unstable. It is known that this drawback can be solved by using a multi-bit D/A converter. However, the multi-bit D/A converter requires, e.g., a high-accuracy analog circuit element having 16 or more bits, therefore, the $\Delta\text{-}\Sigma$ modulator loses an important advantage for an IC, i.e., the $\Delta\text{-}\Sigma$ modulator can be constituted by elements having no high accuracy. When a high-accuracy analog circuit element is used, A/D converters other than a $\Delta\text{-}\Sigma$ modulator can be sufficiently used. Nevertheless, when a $\Delta\text{-}\Sigma$ modulation type A/D converter is used, the $\Delta\text{-}\Sigma$ modulation type A/D converter loses its merit, because an A/D converter having 16-bit accuracy which can be obtained with good reproducibility without trimming an IC pattern in an IC is almost limited to a 1-bit (binary) converter. In converters other than a 1-bit converter, even when the 16-bit accuracy can be obtained, an area occupied by the converter is to be excessively large.

Second, in the $\Delta\text{-}\Sigma$ modulator, since the output voltage amplitude of a latter-stage integrator is increased more rapidly than that of a former-stage integrator to degrade a whole dynamic range. For example, an integrator must be able to output a voltage having an amplitude twice the maximum input range without distortion in a $\Delta\text{-}\Sigma$ modulator for performing first-order integration, and an integrator must be able to output a voltage having an amplitude four times the maximum input range without distortion in a $\Delta\text{-}\Sigma$ modulator for performing second-order integration. Therefore, a dynamic range is determined at a portion where the maximum amplitude is generated. Although this problem can be solved by using a multi-bit D/A converter, the above problem on the accuracy of elements occurs. When an IC is formed by the elements, a high-accuracy A/D converter cannot be obtained.

Therefore, when the S/N ratio of a $\Delta\text{-}\Sigma$ modulator is to be improved, extensive studies for developing a circuit arrangement using only a 1-bit D/A converter have been made. For example, an effort of this development is described in the literature "Reduction of Quantization noise of 1-bit Over-Sampling Type A/D Converter", Ken Yoshitome and Kuniharu Uchimura, (lecture papers A-126 in the 1988's spring national meeting of the Institute of Electronics, Information and Communication Engineers). In this literature, the following example is disclosed. That is, although 1-bit resolution D/A converters are used in conventional first- and second-order $\Delta\text{-}\Sigma$ modulators, a multibit quantizer is used as an A/D converter, and quantization noise caused by a difference between the number of bits of the multi-bit quantizer and the number of bit of the 1-bit D/A converter is removed by digital processing. Therefore, according to this method, an S/N ratio can be advantageously improved compared with a conventional $\Delta\text{-}\Sigma$ modulator having 1-bit A/D and D/A converters. However, since the 1-bit D/A converter is used in this method, the second problem is not solved yet, and therefore, the first problem is not solved.

As described above, in a conventional $\Delta\text{-}\Sigma$ modulation type A/D converter, the output voltage amplitude of a latter-stage integrator is increased more rapidly than that of a former-stage integrator to degrade a whole dynamic range. For this reason, a multi-bit D/A converter may be used to solve this problem. However, the A/D converter with a high accuracy can not be attained by the multi-bit D/A converter.

SUMMARY OF THE INVENTION

It is an object of the present invention to provide a general $\Delta\text{-}\Sigma$ modulation type A/D converter which includes two or more integrators and in which stability can be assured without requiring a high-accuracy element and the output amplitudes of the integrators can be kept to be small.

According to one aspect of the present invention, there is provided a $\Delta\text{-}\Sigma$ modulation type A/D converter comprising at least two integrators connected in series, a multibit A/D converter connected to a last integrator, and a plurality of D/A converters arranged in a feedback loop constituted by the integrators and the A/D converter, wherein the number of quantization levels of a feedback signal supplied to second and subsequent integrators is larger than the number of quantization levels of a feedback signal supplied to the first integrator.

According to another aspect of the present invention, there is provided a $\Delta\text{-}\Sigma$ modulation type A/D converter comprising first and second D/A converters for converting a digital signal into an analog signal, a first subtracter for subtracting an output signal from the first D/A converter from an input signal, a first integrator for integrating an output signal from the first subtracter, a second subtracter for subtracting an output of the second D/A converter from an output of the first integrator, a second integrator for integrating an output from the second subtracter, and an A/D converter for converting an output from the second integrator into a digital signal, wherein the output signal from the A/D converter is input to the first and second D/A converters, and output signals from the first and second converters are used as outputs from the Δ-Σ modulation type A/D converter.

In an over-sampling type A/D converter according to the present invention includes N (N is an integer of not less than 2) integrators, one multibit A/D converter, and D/A converters. A 1-bit signal is used as only a feedback signal supplied to the first integrator, and a multibit feedback signal having more than 3 values is supplied to the second and subsequent integrators. For this reason, a feedback signal having the highest accuracy is supplied to the first integrator, which influences the accuracy of the D/A converter more than any other integrator, to keep a whole S/N ratio to be high. Meanwhile, the multibit feedback signal is supplied to other integrators, which does not almost influences the accuracy of the D/A converter, to decrease output amplitudes of the second and subsequent integrators. With the above arrangement, when linear operation ranges of the integrators are equal to those of conventional integrators, the over-sampling type A/D converter can be operated without distortion even if a high level input is inputted, and a dynamic range can be increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a block diagram showing an A/D converter according to another embodiment of the present invention;

FIG. 10 is a block diagram showing an A/D converter in which the output of the binary D/A converter is connected to a first integrator and the output of one multibit D/A converter is connected to the outputs of a plurality of integrators according to still another embodiment of the present invention;

DETAILED DESCRIPTION OF THE PREFERRED EMBODIMENTS

Figure 1:
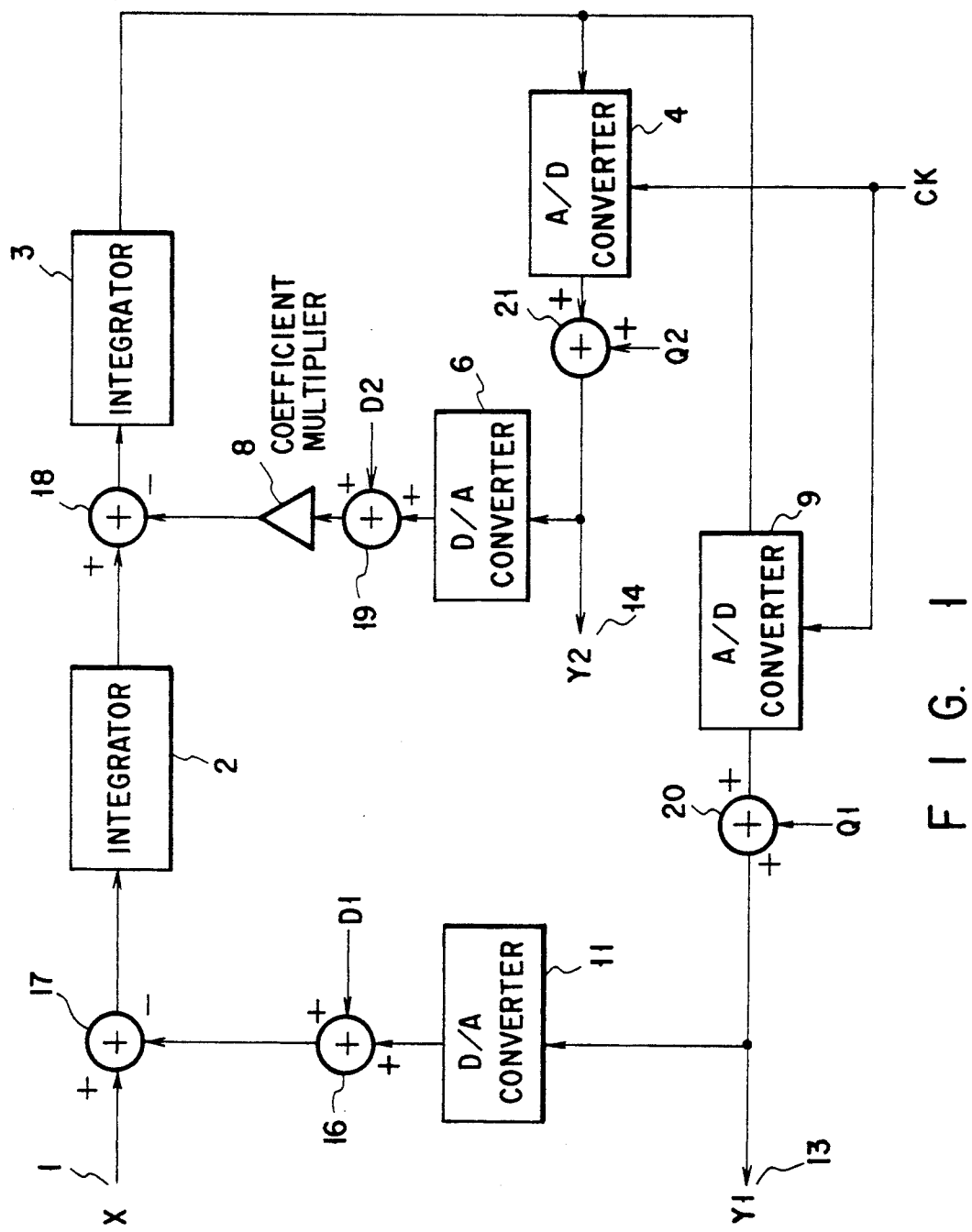
FIG. 1 is a block diagram for explaining the principle of an A/D converter according to the present invention.

FIG. 1 is a view for explaining the principle of an A/D converter according to the present invention, and FIG. 1 shows the arrangement of an improved second-order Δ-Σ modulator. Note that a digital signal processing circuit is omitted in FIG. 1.

In FIG. 1 an input signal X is supplied to an input signal terminal 1. A first stage integrator 2 is connected to a second stage integrator 3 through an adder 18, and the output terminal of the second stage integrator 3 is connected to the input terminal of a second A/D converter 4. The output terminal of the second A/D converter 4 is connected to the input terminal of a second D/A converter 6 through an adder 21. The output terminal of the second D/A converter 6 is connected to a coefficient multiplier 8 through an adder 19, and the output terminal of the coefficient multi-plier 8 is connected to the adder 18. The output terminal of a first A/D converter 9 is connected to the output terminal of the integrator 3, and the output terminal of the first A/D converter 9 is connected to the input terminal of a first D/A converter 11 through an adder 20. Output signals Y1 and Y2 are output through first and second digital output terminals 13 and 14, respectively. A clock CK is supplied to the A/D converters 4 and 9. In this case, the first D/A converter 11 is a binary (1-bit) converter, the second D/A converter 6 is a multi-valued converter which has more than 3 values. Although the first and second A/D converters 4 and 9 are independently shown in FIG. 1 for descriptive convenience, since 1-bit converter is used as the first A/D converter, the MSB (sign bit) output of the second A/D converter can be used without being changed, and a circuit size can be decreased.

An output from the D/A converter 11 is imaginarily shown in FIG. 1, and the adder 16 adds the output of the D/A converter 11 to a noise signal D1 generated due to distortion generated in the D/A converter 11. The value obtained by this addition is subtracted from the signal X input from the terminal 1, and the value obtained by this subtraction is integrated by the first stage integrator 2. An output from the D/A converter 6 is imaginarily shown in FIG. 1, and the adder 19 adds the output of the D/A converter 6 to a noise signal D2 generated due to distortion generated in the D/A converter 6. The value obtained by this addition is multiplied by a constant (e.g., two) in the coefficient multiplier 8, and the multiplication value is subtracted from the integrated value of the integrator 2 and input to the second integrator 3. An output from the second stage integrator 3 is input to the A/D converters 4 and 9. The digital outputs from the A/D converters 4 and 9 are input to the D/A converter 11 to be converted into analog signals again, and the analog signals are finally input to the integrators 2 and 3 so as to form a feedback loop. Signals Q1 and Q2 respectively represent quantization noise components of the A/D converters 9 and 4, and the signals are imaginarily added to the output signals from the A/D converters 9 and 4 by the adders 20 and 21, respectively. Signals D2 and D1 represent noise components caused by distortion generated in the D/A converters 6 and 11, respectively.

When the integrators 2 and 3 are constituted by switched capacitor integrators popularly used in a $\Delta$-$\Sigma$ modulator, since the transfer function of the switched capacitor integrator is represented by $Z^{-1}/(1-Z^{-1})$, a system shown in the block diagram of FIG. 1 is represented by the following equations:

$$Y1 = \left\{ (X - Y1 - D1)\frac{Z^{-1}}{1 - Z^{-1}} - \right. \tag{1}$$

$$\left. 2(Y2 + D2) \right\} \frac{Z^{-1}}{1 - Z^{-1}} + Q1$$

$$Y2 = \left\{ (X - Y1 - D1)\frac{Z^{-1}}{1 - Z^{-1}} - \right. \tag{2}$$

$$\left. 2(Y2 + D2) \right\} \frac{Z^{-1}}{1 - Z^{-1}} + Q2$$

for $Z = \exp(j\omega T)$ where $j$ is an imaginary unit; $\omega$ is an angular frequency; and $T$ is a sampling period of a switched capacitor integrator. This sampling period is usually equal to the period of the clock signal CK. For keeping the A/D converter stable, and obtaining a simple calculation, the coefficient of the coefficient multiplier is set to be 2.

When equations (1) and (2) are solved with respect to Y1, the following result can be obtained:

$$\begin{aligned} Y1 &= Z^{-2}(X - D1) - 2Z^{-1}(1 - Z^{-1})D2 + \\ & \quad (1 - Z^{-1})^2 Q1 + 2Z^{-1}(1 - Z^{-1})(Q1 - Q2) \\ &= Z^{-2}(X - D1) - 2Z^{-1}(1 - Z^{-1})D2 + \\ & \quad (1 - Z^{-2})Q1 - 2Z^{-1}(1 - Z^{-1})Q2 \end{aligned} \tag{3}$$

In a conventional arrangement, i.e., when one A/D converter and one D/A converter are arranged, in equation (3), since it can be assumed that $Q1 = Q2 = Q$ and $D1 = D2 = D$, the following result can be obtained:

$$\begin{aligned} Y1 &= Y2 = Z^{-2}(X - D) - 2Z^{-1}(1 - Z^{-1})D + \\ & \quad (1 - Z^{-1})^2 Q \\ &= Z^{-2}X - Z^{-1}(2 - Z^{-1})D + (1 - Z^{-1})^2 Q \end{aligned} \tag{4}$$

According to equation (4), the following can be understood.

1. Noise In Conventional Arrangement

In a conventional arrangement, as is known well, a noise signal Q is output through a filter having second-order high-pass characteristic represented by $(1-Z^{-1})^2$, and a noise signal D is output through a filter having characteristic represented by $-Z^{-1}(2-Z^{-1})$. Therefore, although the noise signal Q having a largely attenuated low-frequency component is output, since the amplitude characteristic of the filter through which the noise signal D passes is set to be almost 1 when the angular frequency $\omega$ is small, the low-frequency component of the noise signal D is output without being changed. For this reason, an S/N ratio equal to or higher than a finally necessary S/N ratio is required to the noise signal D, i.e., the accuracy of the D/A converter.

According to equation (3), the following can be understood.

2. Noise Caused By Distortion Generated In D/A Converter

According to the first half of equation (3), the following is known. Although the signal D1 having the same transfer characteristic as that of the input signal X is output without being changed, the signal D2 is output through a filter having first-order high-pass characteristic represented by $-2Z^{-1}(1-Z^{-1})$.

Therefore, in the signal Y1, an influence of the noise signal D2 on low-frequency range noise is smaller than that of the noise signal D1, and the noise signal D2 rarely influences a decrease in S/N ratio of a whole $\Delta$-$\Sigma$ modulator, because the magnitude of $(1-Z^{-1})$ is low when the angular frequency $\omega$ is low. Thus, the S/N ratio of the whole $\Delta$-$\Sigma$ modulator is controlled by the signal D1 but not by the signal D2. In other words, depending on the influence on the final S/N ratio, the accuracy of the D/A converter 6 may be lower than that of the D/A converter 11. Therefore, in the conventional technique, the D/A converters 11 and 6 are not independently arranged, and a binary D/A converter is used commonly as these converters 11 and 6. According to the present invention, a multibit D/A converter can be used as the D/A converter 6 while an S/N ratio is rarely decreased. However, since the signal D1 is directly output, the D/A converter 11 requires an S/N ratio equal to or higher than a finally necessary S/N ratio. In recent IC manufacturing techniques, since the accuracy of a D/A converter obtained without trimming is about 13 bits at most, when accuracy higher than 13 bits is required, a binary D/A converter must be used even in the present invention.

3. Distribution Of Quantization Noise Of A/D Converter

According to the second half of equation (3), the following can be understood. That is, the quantization noise signal Q1 generated by the A/D converter 9 outputs through a filter having high-pass filter characteristic represented by $(1-Z^{-2})$, and the quantization noise signal Q2 generated by the A/D converter 4 outputs through a filter having high-pass characteristic represented by $-2Z^{-1}(1-Z^{-1})$. When the noise signal Q1 is compared with the noise signal Q generated by the converter having the conventional arrangement described in item 1, although the signal Q1 outputs to have a second-order differential characteristic, the signal Q1 is outputs to have a first-order differential characteristic. For this reason, quantization noise is increased compared with that in a conventional arrangement, and the low-frequency component of the quantization noise signal Q1 larger than that of the quantization noise signal Q is output. Although the quantization noise signal Q2 is output to have the first-order differential characteristic, the quantization noise signal Q1 is generated according to binary A/D conversion, and the quantization noise signal Q2 is generated according to multibit A/D conversion. For this reason, the quantization noise signal Q2 can be easily reduced by increasing the number of bits. Therefore, in order to obtain a higher S/N ratio in the arrangement of the present invention than in the conventional arrangement, it is important that the effect of the quantization noise signal Q1 must be reduced by some method.

A method for reducing the effect of the quantization noise signal Q1 will be described below. In the basic concept of this method, the A/D converter 9 as a 1-bit converter and the A/D converter 4 as a multibit A/D converter are used.

The following equation (5) is established by eliminating Q1 from equations (1) and (2):

$$Y1-(1-Z^{-2})(Y1-Y2)=Z^{-2}(X-D1)-2Z^{-1}(1-Z^{-1})D2+(1-Z^{-1})^2Q2 \quad (5)$$

Although the right-hand side of equation (5) has the same form as that of the right-hand side of the first equation of equation (4), Q2 smaller than Q1 appears in place of Q, D1 appears in the first term of equation (5) in place of D, and D2 appears in the second term in place of D. That is, when the value of the left-hand member of equation (5) is calculated using the arrangement of the present invention, quantization noise can be greatly reduced compared with using the conventional arrangement. In addition, although D2 is not necessarily smaller than D1, since D2 is output through a first-order high-pass filter, though D1 is directly output, D2 is rarely superposed on output noise.

The following must be noticed. That is, all the values of the left-hand member of equation (5) can be obtained by digitally calculating the values obtained directly from an output terminal as digital values, all the values of the right-hand side can be obtained by calculating analog values, and signals other than the input signal X have values which cannot directly be observed from the outside of the A/D converter. Since the signals Y1 and Y2 are digital signals obtained by A/D-converting an output signal from the second integrator 3, the MSB (sign bit) of the signal Y2 corresponds to the signal Y1 itself. Therefore, since both the signals Y1 and Y2 can be obtained from an output from the multibit A/D converter 4, the 1-bit A/D converter need not be additionally arranged. If the 1-bit A/D converter 9 is additionally arranged, since its output is not always equal to the MSB output from the multibit A/D converter 4 due to an offset, accuracy, or the like, both the signals Y1 and Y2 are desirably obtained from the output from the multibit A/D converter 4.

The left-hand member of equation (5) can be rewritten as in, e.g., the following equation:

$$Y1-(1-Z^{-2})(Y1-Y2)=Z^{-2}Y1+(1-Z^{-2})Y2 = Y2+Z^{-2}(Y1-Y2) \quad (6)$$

Therefore, in order to actually calculate the left-hand member of equation (5), depending on an object, a calculation capable of obtaining an actual method of decreasing an amount of hardware for digital calculation is preferably selected.

The details of the above description are summed up as follows. Qualitatively, a D/A converter having D1 as small as possible is used as a first local DAC (D/A converter), and a D/A converter having Q2 as small as possible is used as a second local DAC. Therefore, it is apparent that a Δ-Σ modulation type A/D converter having a small amount of quantization noise and a small amount of distortion can be obtained.

Figure 2:
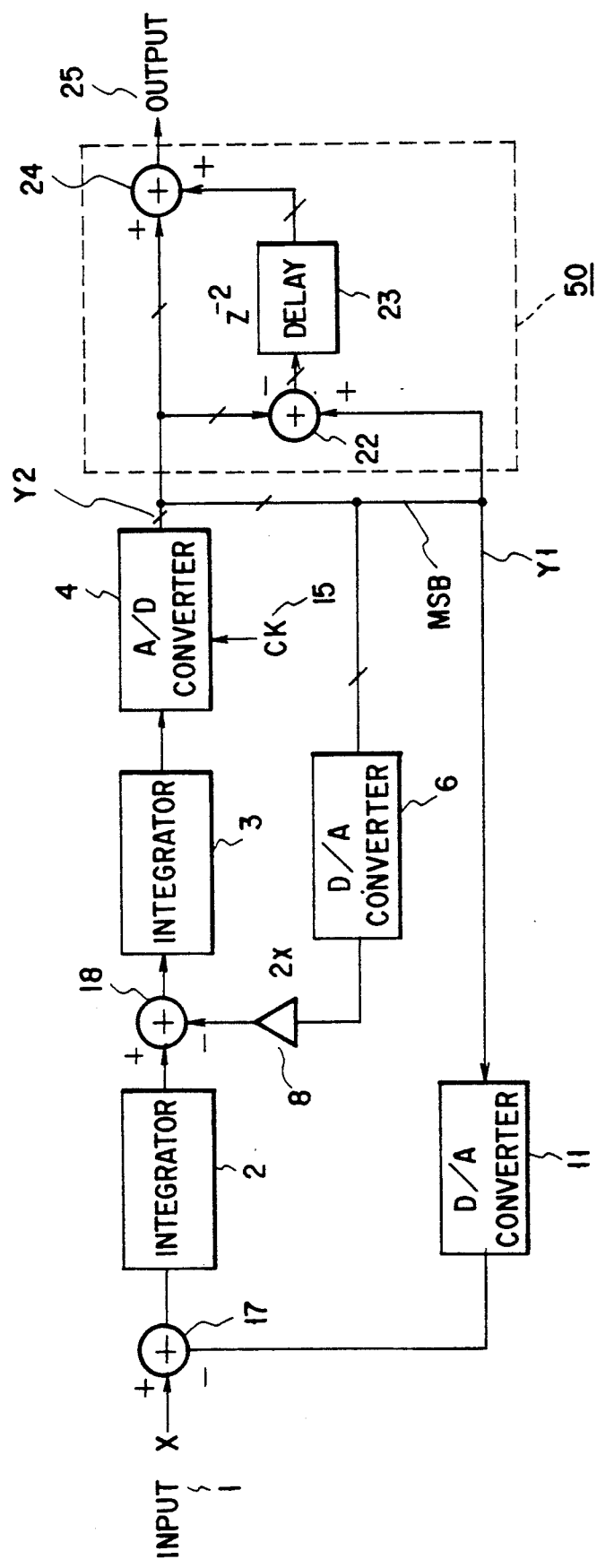
FIG. 2 is a block diagram showing an A/D converter according to an embodiment of the present invention.

FIG. 2 obtained by summing up the above results is a block diagram for explaining an arrangement of the first embodiment of the present invention. In FIG. 2, a description of the same parts as in FIG. 1 will be omitted. In FIG. 2, unlike in FIG. 1, an MSB (sign bit) of an output from the A/D converter 4 is used as an input of the 1-bit D/A converter 11, and the output Y2 is subtracted from an MSB (Y1) included in an output Y2 from the A/D converter 4 by a subtracter 22. A value obtained by delaying the resultant signal Y1−Y2 by 2 clocks in a delay circuit 23 is added to the signal Y2 by an adder 24, and the result is output to an output terminal 25. Since multibit converters are used as the A/D converters 4 and 6 as in the arrangement of the present invention, the output amplitude of the second integrator 3 can be reduced. According to the arrangement of the present invention, since digital signal processing is performed by the adder 22, the delay circuit 23, and the adder 24, quantization noise at the output terminal 25 can be reduced compared with in a conventional arrangement.

In the above description, although the coefficient of the coefficient multiplier 8 in FIG. 1 is set to be 2 for obtaining a simple calculation, a case wherein the coefficient is set to be an arbitrary value μ will be described below.

When calculations are performed such that the same assumptions as in the above calculations are set, a system represented by the block diagram of FIG. 1 will be described below:

$$Y1 = \left\{ (X - Y1 - D1)\frac{Z^{-1}}{1 - Z^{-1}} - \mu(Y2 + D2)\right\}\frac{Z^{-1}}{1 - Z^{-1}} + Q1 \quad (6)$$

$$Y2 = \left\{ (X - Y1 - D1)\frac{Z^{-1}}{1 - Z^{-1}} - \mu(Y2 + D2)\right\}\frac{Z^{-1}}{1 - Z^{-1}} + Q2 \quad (7)$$

Since Y1−Y2=Q1−Q2, when Q1 is eliminated from equation (6), the following equation can be obtained:

$$Z^{-2}Y1 - (1 - Z^{-1})\{1 - (1-\mu)Z^{-1}\}Y2 = \quad (8)$$
$$Z^{-2}(X - D1) - \mu Z^{-1}(1 - Z^{-1})D2 + (1 - Z^{-1})^2Q2$$

Therefore, when the left-hand member of equation (8) is calculated as described above, noise is canceled, and multibit quantization noise Q2 smaller than 1-bit quantization noise Q1 appears at the output terminal of a final Δ-Σ modulation type A/D converter, thereby improving the accuracy of the A/D converter. In this case, all the values of the left-hand member can be digitally calculated from a digital value in the same as in the above description. A block diagram representing an arrangement of a general second-order Δ-Σ modulation type A/D converter including a coefficient μ is shown in FIG. 3. A digital signal processing circuit 50 shown in FIG. 3 performs digital signal processing for canceling noise.

Since the value μ is determined depending on an element value of an analog circuit, the value μ assumed by digital signal processing is not always equal to the value μ actually obtained by an analog circuit. For this reason, an influence given when the value μ is changed into a value μ+Δμ will be examined. In equation (8), when μ is increased by Δμ, the following expression can be obtained in accordance with this increase:

$$-(1-Z^{-1})\Delta\mu Z^{-1} Y2 \qquad (9)$$

Therefore, when the estimated value is different from the actual value by Δμ, noise corresponding to expression (9) is added to a signal. In expression (9), although the value Δμ/μ corresponds to a coefficient error of an integrator, when a general switched capacitor integrator is used as the integrator, a value of about 0.1% (=−60 dB) can be easily obtained as the value Δμ/μ by a recent technology. In addition, contribution of the term of $(1-Z^{-1})$ can be estimated in the same manner as that of the quantization noise of a first-order Δ-Σ modulation type A/D converter. When a digital audio signal requiring 16-bit accuracy is exemplified, since an over-sampling ratio of about 256 times is required, noise of about −50 dB due to the contribution of the term of $(1-Z^1)$ appears within a whole signal frequency range. For this reason, assuming that a signal Y2 corresponding to a full scale is input, noise caused by Δμ appears at a level of about 110 dB or less of the full scale. This increase in noise can be neglected, since a S/N ratio in 16 bits for example is about 96 dB. Therefore, when the present invention is applied, it is apparent that an increase in noise caused an error of a coefficient multiplier falls within a negligible range.

Figure 4:
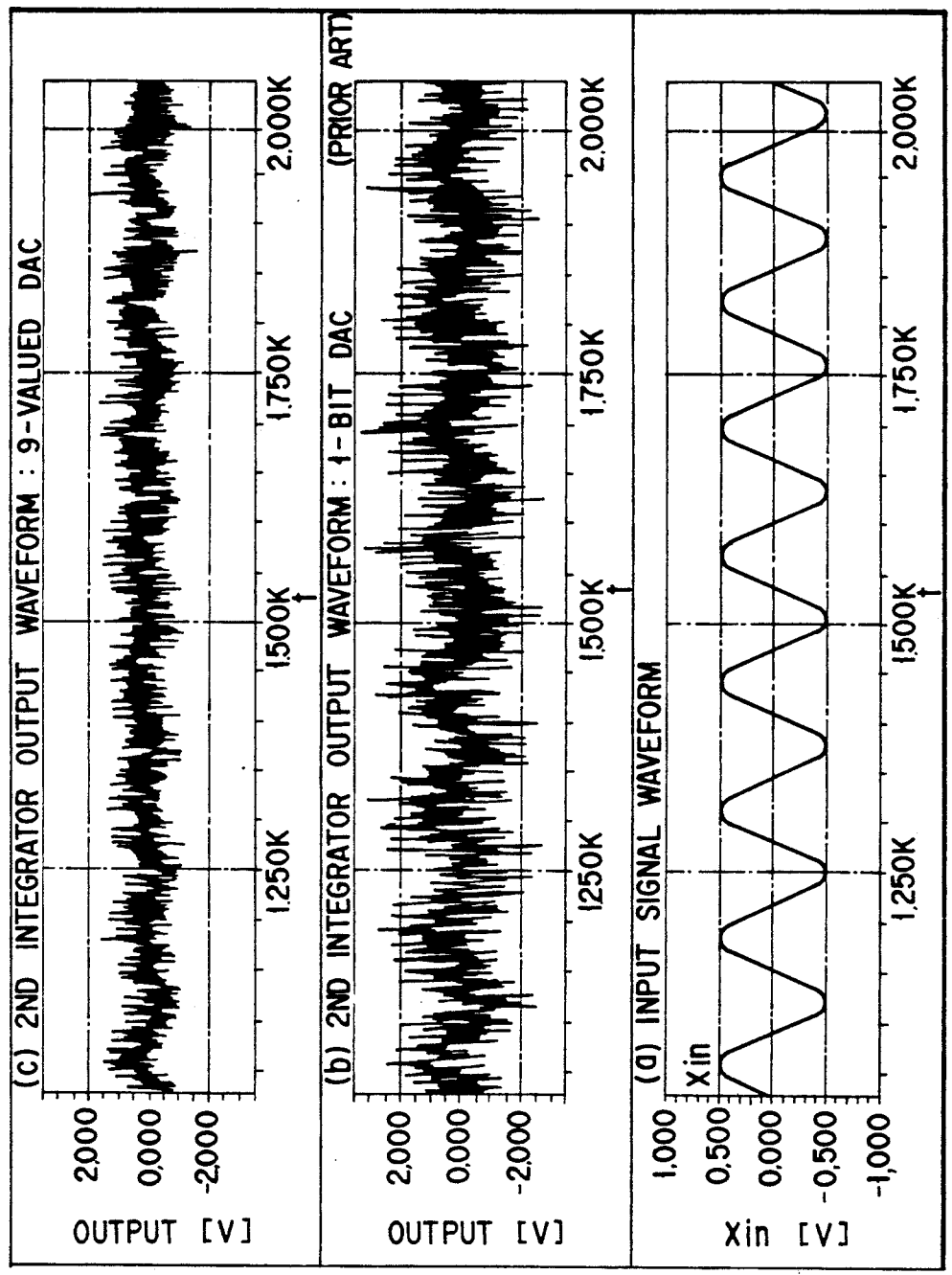
FIG. 4 is a graph for explaining an advantage of the A/D converter in FIG. 2.

FIG. 4 is a view for explaining an improvement of the first embodiment of the present invention over the prior art, and FIG. 4 shows comparative simulated output signal waveforms of a second integrator in a conventional second-order Δ-Σ modulator using a conventional 1-bit A/D D/A converter and the second order Δ-Σ modulator applying the present invention. In FIG. 4, the abscissa represents a normalized time, and the ordinate represents an output amplitude. In FIG. 4, reference symbol (a) denotes an input signal waveform; (b), an output waveform of a second integrator when a binary converter is a conventional A/D.D/A converter; and (c), an output waveform of the second integrator when a 9-valued A/D converter, a 9-valued D/A converter, and a binary D/A converter are used as the A/D converter, the second D/A converter, and the first D/A converter according to the present invention, respectively. Comparing (b) with (c), the maximum value of the output amplitude of the second integrator is decreased to be half. Therefore, even when the 9-valued A/D and D/A converters are used, the effect of the present invention can be obtained.

Figure 5:
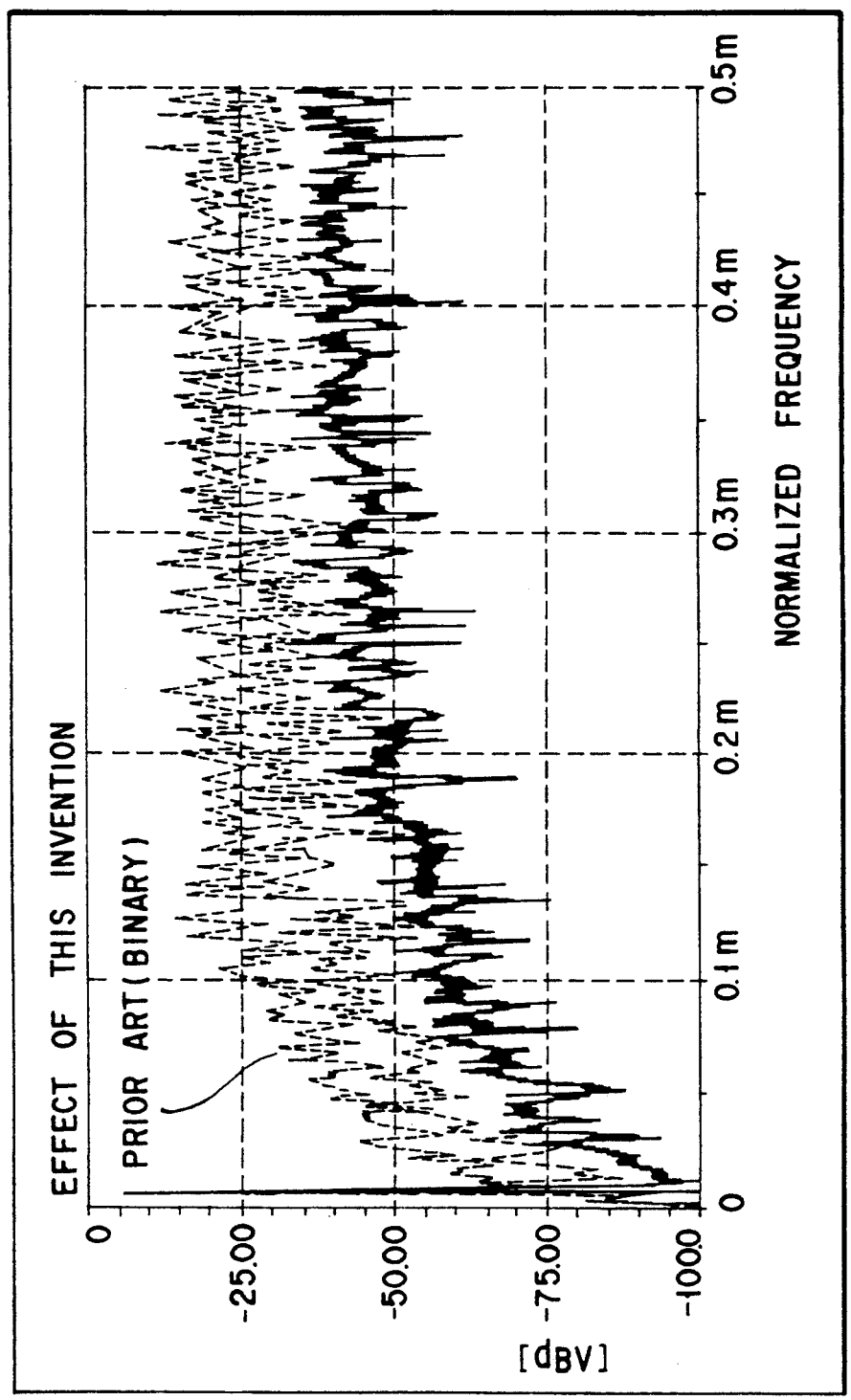
FIG. 5 is a graph showing a spectrum of an A/D conversion output of the A/D converter in FIG. 2 according to a simulation.

FIG. 5 shows a result obtained by simulating a spectrum of an A/D conversion output obtained with the arrangement in FIG. 2. In FIG. 5, the ordinate represents a spectrum of an output digital value in decibels, and the abscissa represents a frequency normalized by a sampling frequency. As apparent from FIG. 5, when the D/A converter 6 is a 5-valued converter or a 29-valued converter, a noise component is decreased by about 15 dB and 30 dB, respectively, compared with a case wherein the quantization level of the D/A converter 6 is set to be binary.

The line spectrum of FIG. 5 is a spectrum generated by a sine-wave input signal having an amplitude of 0.5 V, and spectra other than the line spectrum are regarded as noise components. This simulation is performed assuming that the range of the input full scale of the A/D converter is set to be ±2 V and that the sine-wave input signal is quantized to a 5-valued signal or 29-valued signal value within this range. An output from the D/A converter 11 is a binary output of ±1 V, the D/A converter 6 directly converts the digital output from the A/D converter into an analog value. Therefore, in the A/D converter according to this embodiment, the range of the input full scale corresponds to ±1 V.

In addition, when the number of quantization levels of the A/D converter 9 and the D/A converter 6 is increased, since the output from the second integrator is close to the output from the first integrator, saturation levels of both the integrators can be set to be equal to each other. This is advantageous in circuit design. Since the full scales of the A/D converter 9 and the D/A converter 6 are set to be larger than the full scale of the D/A converter 11, even when the input X is to be close to a full scale, unlike in a conventional Δ-Σ modulator using only a binary DAC, an increase in distortion can be advantageously suppressed.

Figure 6:
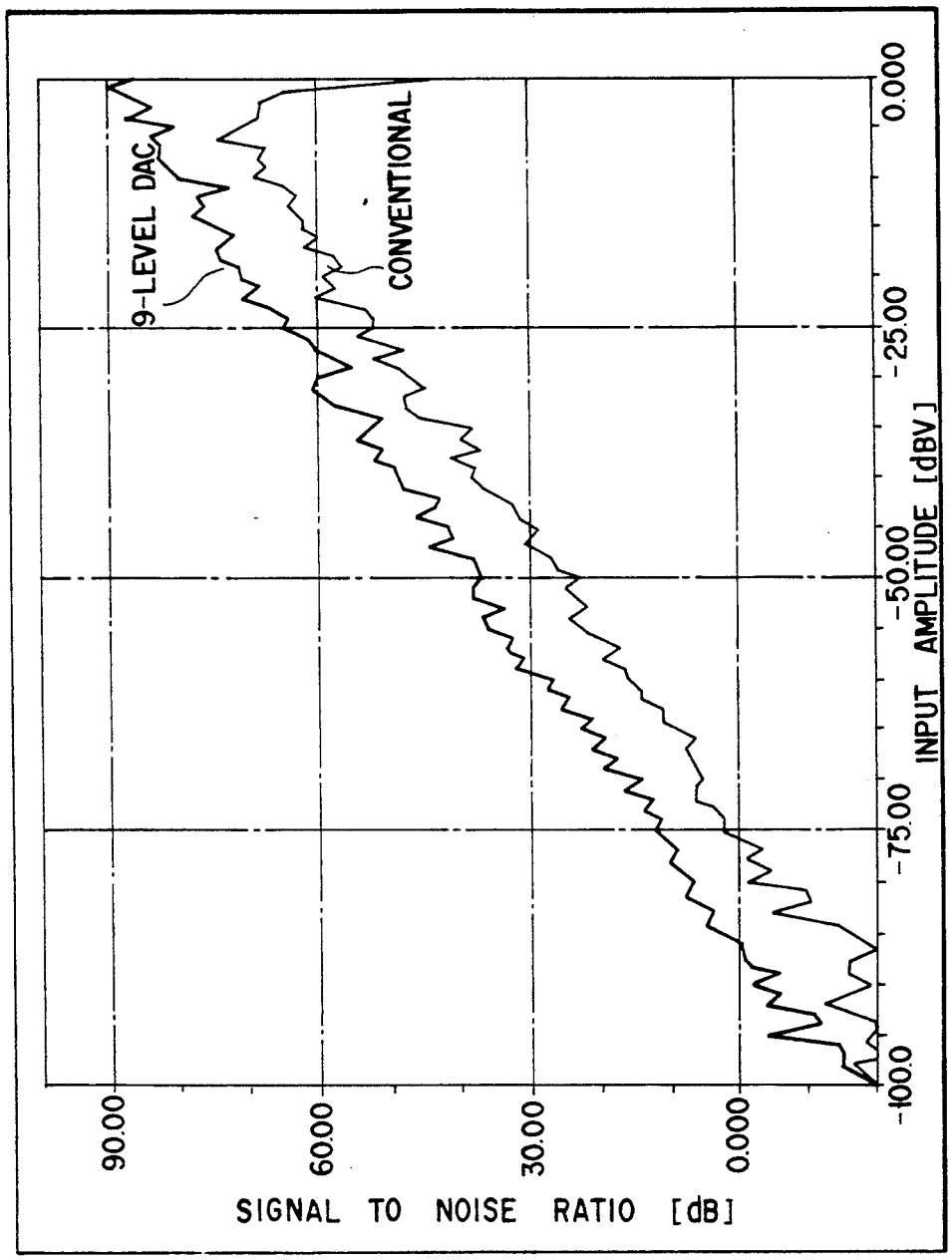
FIG. 6 is a graph showing an S/N ratio of the A/D converter in FIG. 2.

FIG. 6 is a view for explaining this advantage of the present invention. In FIG. 6, the abscissa represents an input signal voltage, and the ordinate represents the S/N ratio of a digital value converted by an A/D converter. As is apparent from FIG. 6, in comparison with use of only a conventional binary D/A converter, when a multibit converter is used as the second D/A converter and the full scale of the multibit converter is set to be twice the full scale of the first D/A converter, not only a total S/N ratio is increased, but saturation of an S/N ratio at a high input level which is characteristic of a conventional Δ-Σ modulator can be improved.

Distortion at a high input signal level can be decreased by setting the full scales of the A/D converter 4 and the D/A converter 6 to be larger than the full scale of the D/A converter 11 because of the following reasons. Since the second problem of the problems for the prior art has been described, i.e., since the output from the first integrator falls within a range about twice the maximum input range, the A/D converter 4 must have a full scale corresponding to this range. In a Δ-Σ modulation type A/D converter having a structure including a plurality of feedback loops shown in FIGS. 1, 2, and 3 and FIG. 7 (to be described later), since the maximum input range is equal to the range of the full scale of the D/A converter included in the outermost feedback loop, the A/D converter 4 must have a full scale having at least a range about twice that of the full scale of the D/A converter 11, and the full scale of the D/A converter 6 must correspond to the full scale of the A/D converter 4.

In a conventional arrangement wherein 1-bit D/A converters are used as all local D/A converters, the local A/D converter is a 1-bit A/D converter. That is, since it is sufficient that only the code (polarity) of an output from an integrator is determined, the full scale itself of the A/D converter is meaningless. For this reason, the full scale of the 1-bit local D/A converter is appropriately determined, and a Δ-Σ modulation type A/D converter having a maximum input range equal to that of the full scale of the 1-bit local D/A converter is obtained.

Figure 7:
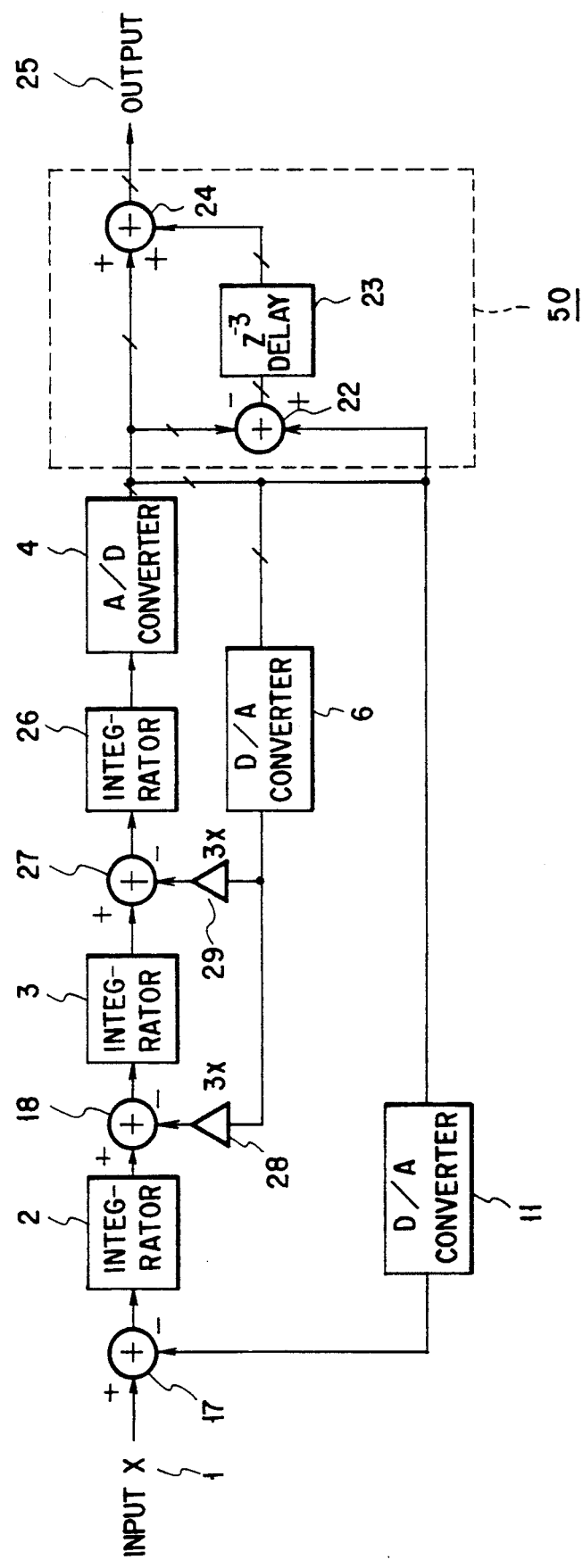
FIG. 7 is a block diagram showing an A/D converter using three integrators according to still another embodiment of the present invention.

FIG. 7 is a block diagram for explaining an arrangement of the second embodiment of the present invention. As shown in FIG. 7, an input X (1) is subtracted from an output from a D/A converter 11 by a subtracter 17, and a output from the subtracter 17 is input to an integrator 2 and integrated therein. In a subtracter 18, an output signal from the integrator 2 is subtracted from a signal obtained by multiplying an output signal from a D/A converter 6 by a predetermined coefficient in a coefficient multiplier 28. After the subtracted signal is input to an integrator 3 and integrated therein, from the signal is subtracted by a subtracter 27 a signal obtained by multiplying an output signal from the D/A converter 6 by a predetermined coefficient in a coefficient multiplier 29. This output signal is integrated in an integrator 26 and then input to an A/D converter 4 to be A/D-converted. This A/D-converted value is fed back to the D/A converter 6 and the D/A converter 11. In addition, an output signal from the A/D converter 4 is subtracted from the MSB of an output signal from the A/D converter 4 by a subtracter 22, and an output from the subtracter 22 is input to a delay circuit 23. An output signal from the subtracter 22 is delayed by 3 clocks in the delay circuit 23, and this delayed signal and the output signal from the A/D converter are added to each other in an adder 24, thereby obtaining an output 25 from the adder 24. That is, the a Δ-Σ modulator described in the second embodiment is a third-order Δ-Σ modulator.

Although a higher order Δ-Σ modulator is generally used to perform highly accurate A/D conversion, when the accuracy of a multibit local DAC used in the Δ-Σ modulator is not higher than a finally necessary accuracy, noise can be reduced by a noise shaping operation, but distortion is not shaped and cannot be reduced. Therefore, a contradictory result is obtained, i.e., the higher order Δ-Σ modulator cannot have necessary accuracy as a whole at last.

The third-order Δ-Σ modulator in FIG. 7 is different from the second-order Δ-Σ modulator shown in FIG. 2 by arranging an integrator 26. That is, according to this embodiment, three integrators are used. Therefore, in order to assure the stability of a feedback loop, the coefficients of the coefficient multipliers 28 and 29 must be set to be appropriate values; In the conventional technique, feedback signals are supplied to three integrators using a 1-bit local D/A comventer or a highly accurate multibit local D/A converter. According to the present invention, a feedback signal for the first integrator is supplied from a binary local D/A converter 11, feedback signals for the second and third integrators 3 and 26 are supplied from the multibit local D/A converter 6. According to the above arrangement, as the local D/A converter which requires the highest accuracy and supplies a feedback signal to the first integrator 2, a binary converter which can be high precision even on an integrated circuit can be used. At this time, a demand for the accuracy of the multibit local D/A converter 6 for supplying feedback signals to the second and third integrators 3 and 26 is mostly satisfied by the same reason as described in the first embodiment.

As in FIG. 1, assuming that reference symbol D1 denotes a signal representing an error of the D/A converter 11; D2, a signal representing an error of the D/A converter 6; Q2, quantization noise of the A/D converter 4 serving as a multibit A/D converter; Q1, quantization noise of the A/D converter 4 serving as a binary A/D converter; Y2, a digital output from the A/D converter serving as the multibit A/D converter; and Y1, a digital output from the A/D converter 4 serving as the binary A/D converter, when Q1 is eliminated by the same manner as described in the first embodiment, the following equation can be obtained:

$$Z^{-3}Y1+(1-Z^{-3})Y2 = z^{-3}(X-D1)-3Z^{-1}(1-Z^{-1})D2+(1-Z^{-1})^3 Q2 \quad (10)$$

Therefore, the quantization noise of the right-hand side of equation (10) can be suppressed to be lower than the noise Q1 of the binary A/D converter, and the error of the multibit D/A converter 6 passes through a first-order high-pass filter to be attenuated and is output as in the first embodiment. For this reason, influences of the quantization noise and the error are decreased.

In this embodiment, each of the gains of the coefficient multipliers 28 and 29 is set to be three times in consideration of their stability.

Equation (10) is preferably deformed such that an amount of calculation for digital signal processing is decreased, thereby realizing equation (10). For example, equation (10) can be rewritten as follows:

$$Y1-(1-Z^{-3})(Y1-Y2) = Y2+Z^{-3}(Y1-Y2) \quad (11)$$

For this reason, equation (11) can be realized by a digital signal processing circuit 50 in FIG. 7. Although the delay circuit 23 performs 2-clock delay ($Z^{-2}$) in the circuit having two integrators in FIG. 2, the delay circuit 23 performs 3-clock delay ($Z^{-3}$) in the second embodiment in FIG. 7.

Although Y1 and Y2 are described as inputs to the digital signal processing circuit 50, since the Y1 is a part of the Y2, it is sufficient to input only the Y2. This is also held in the digital processing section of the digital signal processing circuit 50. In addition, as in the first embodiment in FIG. 2, when the full scales of the A/D converter 4 and the D/A converter 6 are set to be smaller than the full scale of the D/A converter 11, a decrease in S/N ratio near an overloaded portion can be improved.

In order to obtain a final digital output, as in the first embodiment, an amount represented by $Y1-(1-Z^{-3})(Y1-Y2)$ is calculated in a digital form using the output (Y2) of the multibit A/D converter 4 and its MSB, i.e., a sign bit (Y1).

Although a feedback signal for the third integrator 26 may be supplied to the third local D/A converter having a larger number of quantization levels, the second local D/A converter may be sufficiently multivalued at first. However, this is not necessarily advantageous in consideration of complication of a digital processing section connected to the output of the second local D/A converter and an increase in hardware (=an occupied area) of the third local D/A converter.

Figure 8A:
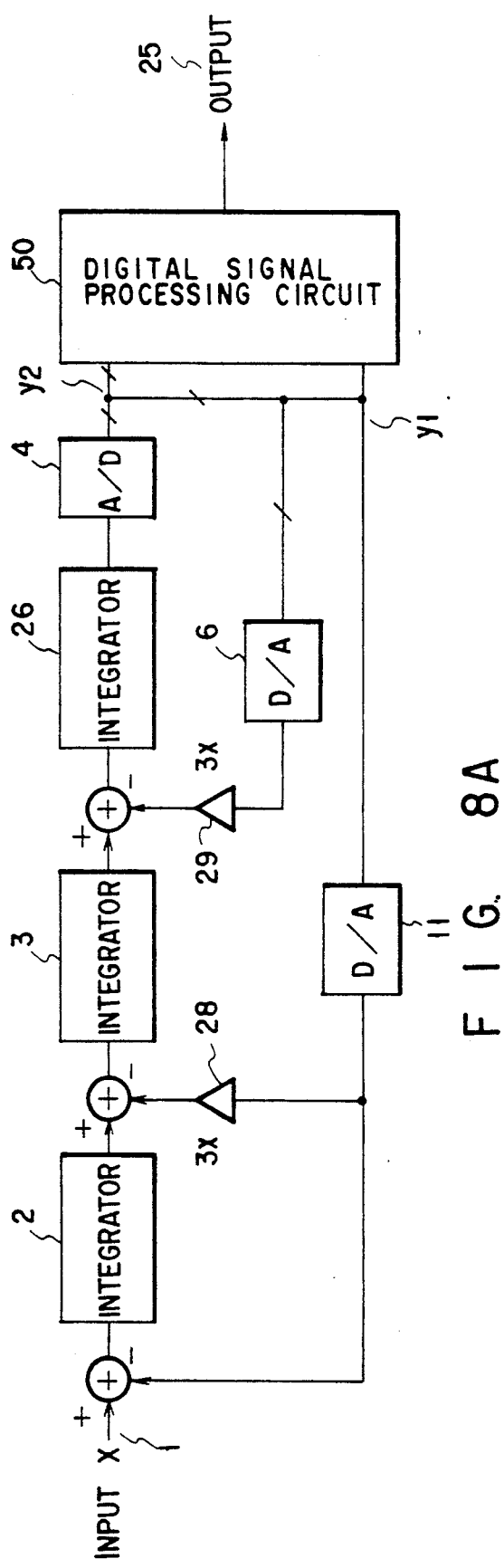
FIG. 8A is a block diagram showing an A/D converter in which the output of a 1-bit D/A converter is connected to first and second integrators according to still another embodiment of the present invention.
Figure 8B:
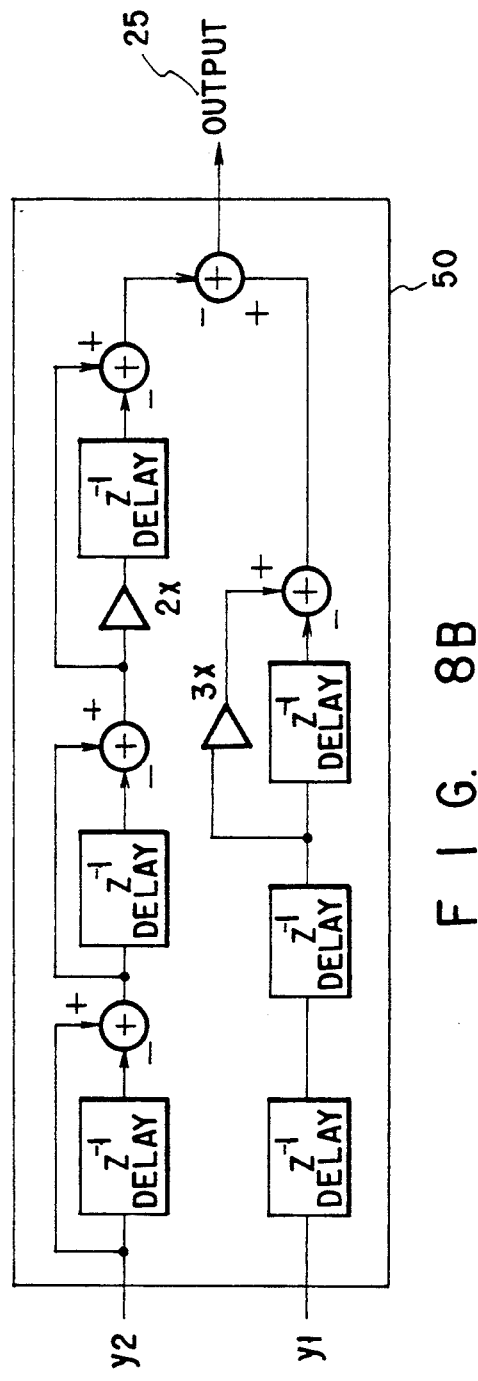
FIG. 8B is a block diagram showing a digital signal processing circuit included in the A/D converter in FIG. 8A.

With the above description, as shown in FIG. 8, a feedback signal may be supplied from a multibit D/A converter 6 to the third integrator 26 such that 1-bit feedback signals are supplied to the first and second integrators 2 and 3.

These operations will be explained below by mathematical expressions.

As in the embodiment in FIG. 7, assuming that reference symbol D1 denotes a signal representing an error of the D/A converter 11; D2, a signal representing an error of the D/A converter 6; Q2, quantization noise of the A/D converter 4 serving as a multibit A/D converter; Q1, quantization noise of the A/D converter 4 serving as a binary A/D converter; Y2, a digital output from the A/D converter serving as the multibit A/D converter; and Y1, a digital output from the A/D converter 4 serving as the binary A/D converter, when Q1 is eliminated as described in the previous embodiment, the following equation can be obtained:

$$Z^{-2}(3 - Z^{-1})Y1 - (1 - Z^{-1})^2(1 - 2Z^{-1})Y2 = Z^{-3}(X - D1) - 3Z^{-2}(1 - Z^{-1})D1 - 3Z^{-1}(1 - Z^{-1})^2 D2 + (1 - Z^{-1})^3 Q2$$

Therefore, the quantization noise of the right-hand side (output) can be suppressed to be lower than the noise Q1 of the binary A/D converter, and the error of the multibit D/A converter 6 passes through a second-order high-pass filter to be attenuated and is output. For this reason, influences of the quantization noise and the error are decreased to be smaller than that of the previous embodiment. At this time, in the above equation, since the second term of the right-hand side represents an error of a binary D/A converter, this value can be decreased to be negligible. However, the output amplitude of the second integrator 3 cannot be suppressed to be small, and the output amplitude of the third integrator 26 is suppressed to only the sam extent to that of the second integrator 3. Therefore, an increase in distortion is disadvantageously greater in this embodiment than in the embodiment shown in FIG. 7. In addition, in this case, the digital signal processing circuit 50 has a complicated arrangement as shown in FIG. 8. In contrast to this, however, since the 1-bit D/A converter 11 having a very small error is used for the first and second integrators 2 and 3, noise occurring due to the error of the D/A converter can be advantageously reduced compared with a case wherein a multibit D/A converter is used for the second and third integrators 3 and 26.

Figure 9:
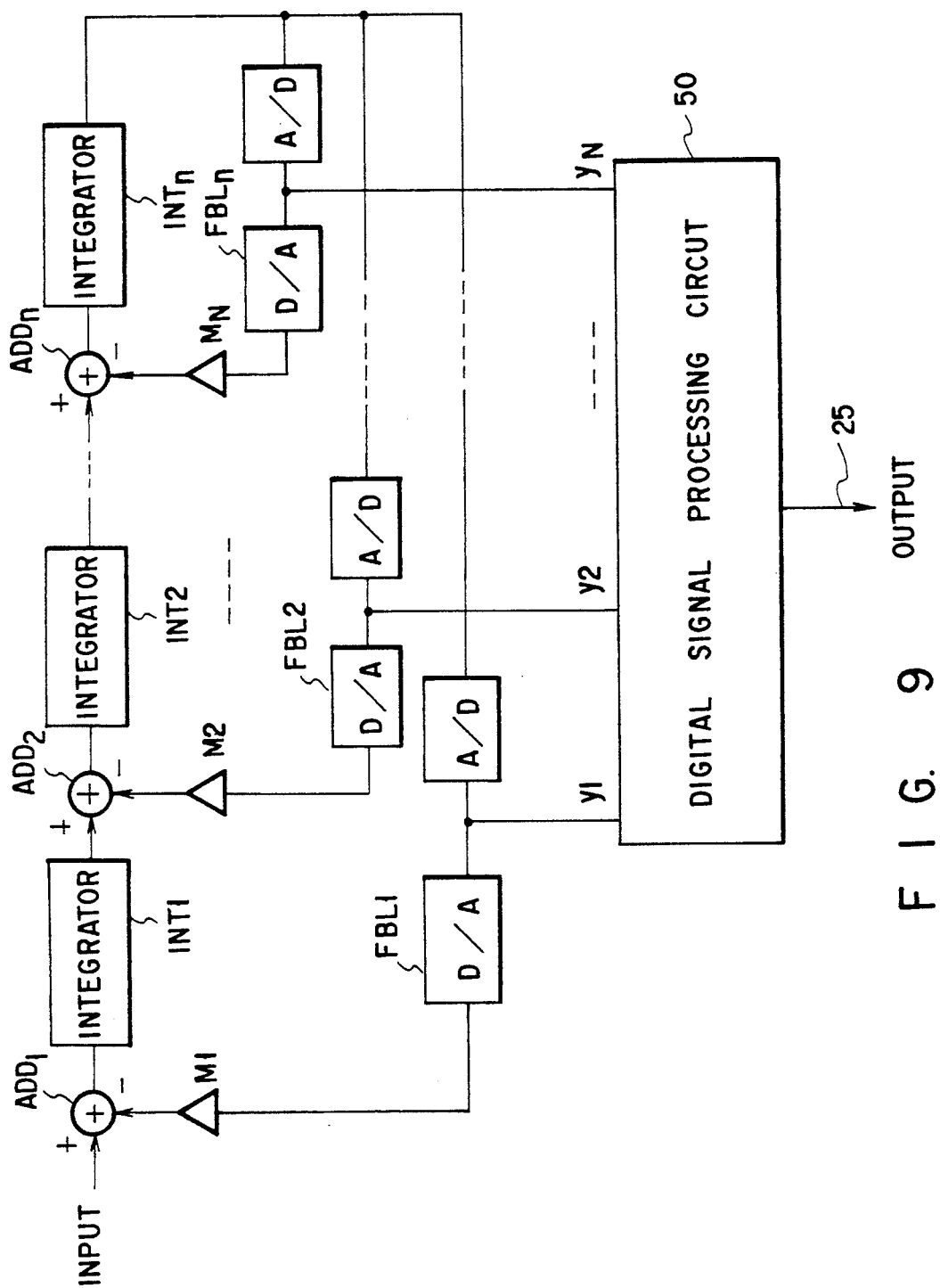
FIG. 9 is a circuit diagram showing an A/D converter in which the outputs of D/A converters are respectively connected to a plurality of integrators according to still another embodiment of the present invention.

FIG. 9 shows a high-order, e.g., fourth or more order, A/D converter according to still another embodiment of the present invention. According to this embodiment, an input terminal and a plurality of integrators $INT_1$, $INT_2$, ... $INT_n$ are connected to each other in series through adders $ADD_1$, $ADD_2$, ... $ADD_n$. A plurality of feedback loops $FBL_1$, $FBL_2$, ... $FBL_n$ each of which is constituted by a D/A converter, an A/D converter, and a coefficient multiplier are connected to the adders $ADD_1$, $ADD_2$, ... $ADD_n$, respectively. The node between the A/D converter and D/A converter of each of the feedback loops is connected to a digital signal processing circuit 50. In this embodiment, the number of quantization levels of each of the D/A converters of the inner feedback loops $FBL_2$, ... $FBL_n$ is set to be equal to or larger than the number of quantization levels (1 bit) of the D/A converter of the outer feedback loop $FBL_1$.

In the embodiment in FIG. 9, two or more feedback loops are arranged. In the embodiment in FIG. 10, two feedback loops $FBL_1$ and $FBL_2$ are arranged, and the inner feedback loop $FBL_2$ is a feedback loop connected to the outputs of adders $ADD_2$, ... $ADD_n$ through series-connected multibit A/D and D/A converters 4 and 6 and a plurality of coefficient multipliers. The outer feedback loop $FBL_2$ is a feedback loop connected to the first adder $ADD_1$ through the multibit A/D converter 4, a 1-bit D/A converter 11, and a coefficient multiplier. A digital signal processing circuit 50 is connected to the node between the A/D converter 4 and the D/A converters 6 and 11.

As described above, a D/A converter having a larger number of quantization levels is assigned as the inner feedback loop rather than as the outer feedback loop of the plurality of feedback loops of a $\Delta$-$\Sigma$ modulation type A/D converter. Although this embodiment has a large degree of freedom of the above assignment, whether this embodiment or the embodiment in FIG. 9 is selected is a matter of design choice, and it may be determined in consideration of a given specification and realizability.

In a higher, e.g., fourth or more order, A/D converter, as described above, only a feedback signal for a first integrator is supplied from a binary local D/A converter, and feedback signals (the number of feedback signals is not limited to one) for second and subsequent integrators are supplied from multibit local D/A converter. Therefore, it is apparent that both the high accuracy and stability of the A/D converter can be obtained.

For descriptive convenience, although switched capacitor integrators are used as the integrators 2 and 3 and the like to assume a transfer function of a discrete time system expressed by the Z transform, each of the integrators 2 and 3 may be constituted by a integrator of a continuous time system such as a normal active RC integrator expressed by variables of the Laplace transform.

Figure 11:
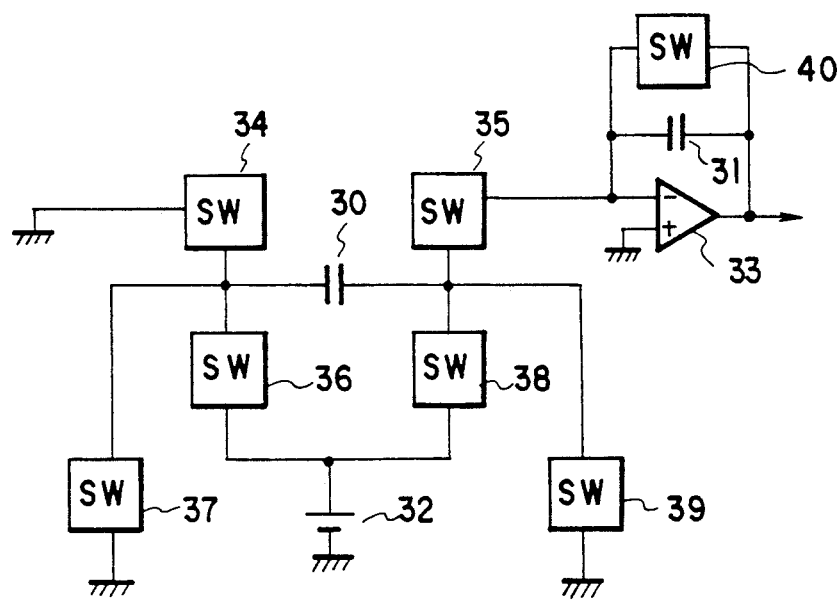
FIG. 11 is a block diagram showing a local D/A converter used in the present invention.
Figure 12:
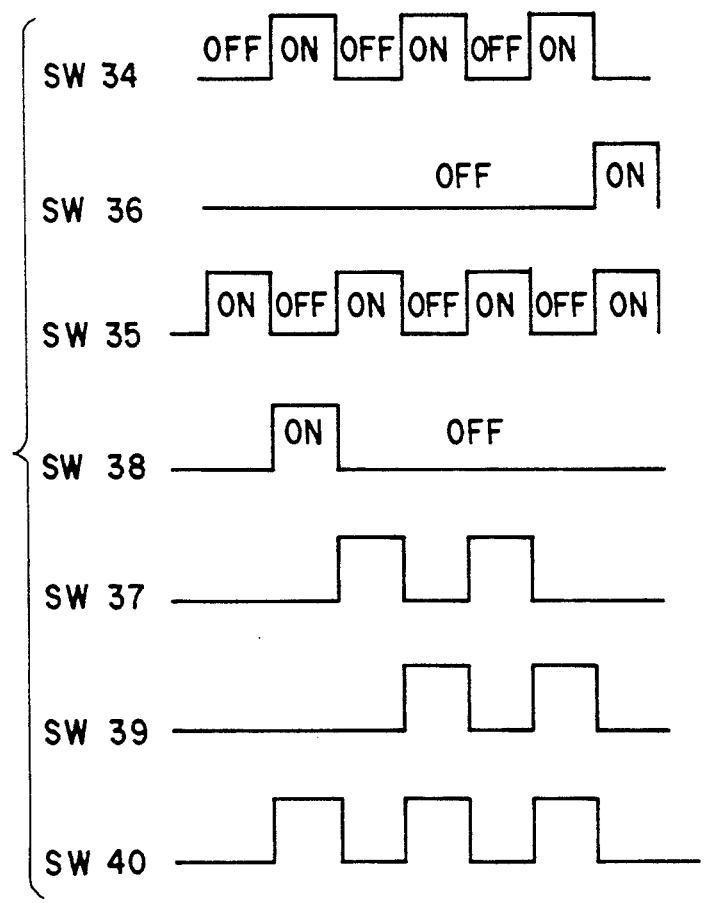
FIG. 12 is a timing chart showing control signals for driving the local D/A converter in FIG. 11.

Although a case wherein a feedback signal for the first integrator is supplied from a binary local DAC has been described above, this local DAC is not actually limited to a binary one, and any highly accurate local D/A converter may be used. In fact, in addition to a binary D/A converter, a 3-valued D/A converter can be easily used on an integrated circuit with high accuracy. For example, a 3-valued D/A converter having values of $\pm 1$ V and 0 V can be obtained by the circuit shown in FIG. 11. In FIG. 11, the voltage of a reference voltage supply 32 is set to be 1 V. Capacitors 30 and 31 have the same value for obtaining a simple calculation. Analog switches 34 and 40 are controlled as shown in FIG. 12. That is, while an output of $+1$ V is required, switches 34 and 38 are turned on, and other switches are kept off, while a switch 35 periodically ON/OFF-controlled at a duty ratio of 1:1 is kept off (the ON and OFF states of the switches 40 and 35 are controlled to be opposite to each other). Only a switch 37 is turned on in a period when the switch 35 is turned on, and other switches are turned off. In the above state, the capacitor 30 is temporarily charged such that the right (in FIG. 11) electrode is set to be positive. Subsequently, when the switch 35 is turned on, all the charges of the electrode are transmitted to the capacitor 31, and an output 34 of an operational amplifier 33 is set to be $\pm 1$ V. When an output of 0 V is required, in the OFF state of the switch 35, switches 34 and 39 are turned on, and other switches turned off. Only the switch 37 is turned off in a period wherein the switch 35 is turned on. With the above arrangement, the capacitor 30 is not charged. When the switch 35 is turned on, since there is no charge to be transmitted, no charge is transfered to the capacitor 31 discharged by the switch 40, and the output 34 of the operational amplifier 33 is set to be 0 V. When an output of $-1$ V is required, in the OFF state of the switch 35, the switches 34 and 39 are turned off, and other switches are turned off. Only a switch 36 is turned on in a period wherein the switch 35 is turned on, and other switches are turned off. With the above arrangement, the left electrode (in FIG. 11) of the capacitor 30 is connected to the positive terminal of the reference power supply 32, and the right electrode is connected an inverting input terminal of imaginary ground of the operational amplifier 33. Since the capacitor 30 is set in a discharging state at first, the left and right electrodes of the capacitor are charged by the reference power supply 32 to have voltages of +1 V and 0 V, and the charging currents are integrated by the capacitor 31. Since the capacitors 30 and 31 have the same value, a voltage of −1 V is output to the output terminal 34. In practice, the opening and closing operations of the switches 34, 36, 35, 37, and 39 are preferably performed such that a logic circuit is formed to be controlled by a 3-valued signal constituted by an output from the A/D converter. In addition, the clock signal 15 can be directly obtained from the switches 35 and 40.

With the above arrangement, even when an operational amplifier has an offset, intervals between three values corresponding to voltages of ±1 V, 0 V, and −1 V can be kept to be 1 V, a 3-valued D/A converter having a very low distortion can be integrated. In addition, an operational amplifier used for each integrator can be used as an operational amplifier 33, an operational amplifier need not be especially prepared. In this case, since the integrators are not reset, the switch 40 is not required. When the switch 34 is not connected to the ground potential but a signal such as an output from the integrator connected to the input of the switch 34, the switch 34 serves as both of a local D/A converter and an adder. A binary D/A converter may be obtained such that the 3-valued D/A converter outputs voltages of ±1 V and −1 V except for a voltage of 0 V. At this time, a logic circuit must be formed such that a control signal for a switch is controlled by the code bit of an output from an A/D converter.

According to the present invention, even when conventional elements are used in a Δ-Σ modulation type A/D converter including two or more integrators, an A/D converter having accuracy higher than that of a conventional A/D converter can be obtained.

More specifically, when the full scales of a local D/A converter and a multibit A/D converter have a value larger than that of a binary local D/A converter, an A/D converter, an S/N ratio of which is not decreased in an almost overloaded state of the A/D converter, can be obtained.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An A/D converter comprising:
   a plurality of stages of integrating means having first stage integrating means for receiving an input signal and last stage integrating means;
   at least one A/D converting means connected to an output terminal of said last stage integrating means;
   at least one outer feedback loop connected from an output terminal of said A/D converting means to at least said first stage integrating means and including first D/A converting means;
   a plurality of inner feedback loops including second D/A converting means connected between the output terminal of said A/D converting means and said plurality of stages of integrating means arranged after said first stage integrating means; and
   means, connected to the output terminal of said A/D converting means, for performing digital signal processing of an output from said A/D converting means to eliminate quantization noise caused by said outer feedback loop,
   wherein said second D/A converting means included in said inner feedback loop has a number of quantization levels larger than that of said first D/A converting means used in said outer feedback loop.

2. The converter according to claim 1, wherein said first D/A converting means included in said outer feedback loop is constituted by a 1-bit D/A converter, and said second D/A converting means included in said inner feedback loops is constituted by a multibit D/A converter.

3. The converter according to claim 1, further comprising a plurality of coefficient multipliers, connected between said second D/A converting mean and said plurality of stage integrating means, for multiplying an output from said D/A converting means by a predetermined coefficient.

4. A converter according to claim 1, wherein said second D/A converting means is constituted by a plurality of multibit D/A converters connected between the output terminal of said A/D converting means and input terminals of said integrating means.

5. A converter according to claim 4, which further comprises a plurality of coefficient multipliers, connected between said plurality of stages of integrating means and said plurality of multibit D/A converters, for multiplying an output from each of said A/D converting means by a predetermined coefficient.

6. A converter according to claim 1, wherein said first D/A converting means is constituted by a 1-bit D/A converter connected to an input terminal of said first stage integrating means and an input terminal of next stage integrating means following said first stage integrating means.

7. A converter according to claim 1, wherein said first stage integrating means includes means for subtracting the input signal from an output from said first D/A converting means and outputting a subtraction result and an integrator for integrating the subtraction result, and each of other integrating means is constituted by means for subtracting an output from said first stage integrating means from an output from said second D/A converting means and outputting a subtraction result, and an integrator for integrating the subtraction result.

8. The A/D converter according to claim 1, wherein said means for performing digital signal processing comprises means for canceling the quantization noise caused by said outer feedback loop by an output signal of said A/D converting means and a sign bit signal within the output signal.

9. The A/D converter according to claim 1, wherein said means for performing digital signal processing includes means for subtracting a sign bit signal within an output signal from the output signal from said A/D converting means and outputting a difference signal, means for delaying the difference signal by a predetermined period and outputting a delayed signal, and means for adding the output signal from said A/D converting means and the delayed signal.

10. The A/D converter according to claim 1, wherein said A/D converting means has a full scale value larger than the maximum amplitude of an output signal from said last stage integrating means.

11. The A/D converter according to claim 1, wherein said A/D converting means has a full scale value larger than that of said first D/A converting means provided in said outer feedback loop.

12. The A/D converter according to claim 1, wherein said second D/A converting means used in said inner feedback loops has a full scale value larger than that of said first D/A converting means used in said outer feedback loop.

13. An A/D converter comprising:
a plurality of stages of integrating means having first stage integrating means for receiving an input signal and last stage integrating means;
a multibit A/D converter connected to an output terminal of said last integrating means;
an outer feedback loop (FBL1) connected between an output terminal of said multibit A/D converter and an input terminal of said first stage integrating means and including a 1-bit D/A converter;
an inner feedback loop (FBL0) including a multibit D/A converter connected between the output terminal of said multibit A/D converter and input terminals of said plurality of stage integrating means arranged after said first stage integrating means; and
means, connected to the output terminal of said A/D converter, for performing digital signal processing of an output from said multibit A/D converter to eliminate quantization noise caused by said outer feedback loop.

14. The A/D converter according to claim 13, further comprising a plurality of coefficient multi-pliers, connected between said multibit D/A converter and said plurality of integrating means, for multiplying an output from said multibit D/A converter by a predetermined coefficient.

15. The converter according to claim 13, wherein said first integrating means includes means for subtracting the input signal from an output from said first D/A converting means and outputting a subtraction result, and an integrator for integrating the subtraction result, and each of other integrating means includes means for subtracting an output from said first integrating means from a output from said second D/A converting means and outputting a subtraction result, and an integrator for integrating the subtraction result.

16. The A/D converter according to claim 13, wherein said means for performing digital signal processing includes means for subtracting a sign bit signal of an output signal from the output signal from said A/D converter and outputting a difference signal, means for delaying the difference signal by a predetermined period and outputting a delayed signal, and means for generating the output signal from said A/D converter and the delayed signal.

17. The converter according to claim 13, wherein said multibit D/A converter used in said inner feedback loops has a full scale value larger than that of said 1-bit D/A converter used in said outer feedback loop.

* * * * *